United States Patent [19]

Hayakawa

[11] Patent Number: 5,105,236
[45] Date of Patent: Apr. 14, 1992

[54] HETEROJUNCTION LIGHT-EMITTING DIODE ARRAY

[75] Inventor: Toshiro Hayakawa, Tokyo, Japan

[73] Assignee: Eastman Kodak Company, Rochester, N.Y.

[21] Appl. No.: 676,617

[22] Filed: Mar. 28, 1991

Related U.S. Application Data

[63] Continuation of Ser. No. 465,696, Jan. 16, 1990, abandoned.

[30] Foreign Application Priority Data

Jun. 23, 1989 [JP] Japan .................................. 1-161791

[51] Int. Cl.⁵ .............................................. H01L 33/00
[52] U.S. Cl. ........................................ 357/17; 357/4; 357/16; 372/45; 372/46
[58] Field of Search .......... 357/4, 16, 17, 30 E, 357/52, 30 H, 30 L; 372/43, 45, 46

[56] References Cited

U.S. PATENT DOCUMENTS

| | | | |
|---|---|---|---|
| 4,148,045 | 4/1979 | Fang et al. | 357/17 |
| 4,167,016 | 9/1979 | Hung et al. | 357/17 |
| 4,207,586 | 6/1980 | Lebailly | 357/16 |
| 4,605,944 | 8/1986 | Ishii et al. | 357/16 |
| 4,616,241 | 10/1986 | Biefeld et al. | 357/16 |
| 4,630,083 | 12/1986 | Yamakoshi | 357/17 |
| 4,644,378 | 2/1987 | Williams | 357/17 |
| 4,675,877 | 6/1987 | Svilans | 372/45 |
| 4,740,819 | 4/1988 | Ouchi et al. | 357/30 |
| 4,759,025 | 7/1988 | Kamejima | 372/45 |
| 4,942,439 | 7/1990 | Schairer | 357/16 |

FOREIGN PATENT DOCUMENTS

| | | | |
|---|---|---|---|
| 56-42388 | 4/1981 | Japan | 357/17 |
| 58-154279 | 9/1983 | Japan | 357/17 |
| 58-223382 | 12/1983 | Japan | 357/17 |
| 61-199679 | 9/1986 | Japan | 357/17 |
| 63-128775 | 6/1988 | Japan | 357/17 |
| 1-32690 | 2/1989 | Japan | 357/17 |

OTHER PUBLICATIONS

Blakeslee et al., "Reducing Resistance in PN Junctions using GaAsP", IBM Technical Disclosure Bulletin, vol. 15, No. 4, Sep. 1972.

Primary Examiner—Rolf Hille
Assistant Examiner—Minhloan Tran
Attorney, Agent, or Firm—Raymond L. Owens

[57] ABSTRACT

A light-emitting diode array is fabricated by forming a light-emitting diode heterojunction at the interface between a superlattice layer comprised of alternations of a multiplicity of semiconductor layers that have different energy gaps, and a doped diffusion mixed region having a larger energy gap than that of the superlattice layer which is formed by impurity doping of part of the said superlattice layer. The light-emitting diode array thus formed exhibits low optical crosstalk and good diode uniformity.

7 Claims, 3 Drawing Sheets

HETEROJUNCTION LIGHT-EMITTING DIODE ARRAY

BACKGROUND OF THE INVENTION

1. Field of the Invention

This is a continuation of application Ser. No. 465,696, filed Jan. 16, 1990, now abandoned.

This invention relates to a light-emitting diode array, and more particularly to a heterojunction light-emitting diode array having a multiplicity of light-emitting diodes closely arrayed on a single substrate.

2. Description of the Prior Art

A light-emitting diode (LED) array consists of multiple p-n or p-i-n junction LEDs fabricated in a single substrate. An advantage of a light-emitting diode array is that it can be used to process image formation with relative ease, by electrically controlling the discrete diodes. Because of this, light-emitting diode arrays are being improved and applied in a variety of ways.

One example relates to the use of printers as hardcopy data output devices. With the increasing importance of electronic information in today's world, printers need to be able to print faster and at higher densities in order to cope not only with the growing amounts of information, but also with the inclusion of image information in the form of graphs, drawings, photographs and the like. One way of achieving this is to use light-emitting diode arrays as the light sources in printers.

Laser printers, which employ a laser light source, and LED printers, which employ an LED array as the light source, are two examples of non-impact optical printers. A laser printer requires the use of a mechanical mechanism such as a rotating polygonal mirror for the scanning laser beam, and a correspondingly complex optical system. An LED printer, on the other hand, only requires a drive system for electrically controlling the discrete diodes (hereinafter also referred to as light-emitting elements) that make up the light-emitting diode array. An LED printer is therefore structurally simple and straightforward, requiring no mechanical moving parts, using instead an optically magnifying lens array, it is possible for LED printers to be smaller, faster and more reliable than laser printers.

FIG. 5 is a cross-sectional illustration of a conventional LED array of an LED printer. For simplicity only two light-emitting elements are shown. With reference to the figure, each light-emitting element is formed by the use of vapor-phase epitaxy (VPE) to deposit an n-GaAsP layer 414 (about 50 microns thick) on an n-GaAs substrate 10, followed by a SiN masking layer 18 and a diffusion of Zn to form Zn diffused regions 420 (each about 1.5 microns thick). The light-emitting element is formed by the p-n junction at the interface between the n-GaAsP layer 414 and the Zn diffused regions 420.

p-Electrodes 22 and an n-electrode 24 are then formed, followed by the application of an antireflection SiN layer 426. The SiN layer 426 is then removed from the non-light-emitting element portions to form a p-electrode 22 bonding pad.

The light-emitting diode array thus formed contains numerous lattice defects owing to a lack of lattice matching between the n-GaAsP layer 414 used as the light-emitting material and the n-GaAs substrate 10. As a result there is considerable non-uniformity of the material itself, so the emission efficiency is low. In addition, because the p-n junction is a homojunction having a low injection efficiency, it is difficult to improve the emission efficiency.

The AlGaAs single heterojunction type light-emitting diode array shown in FIG. 6 was developed to overcome the defects of the homojunction type GaAsP light-emitting diode array described above.

With reference to FIG. 6, liquid-phase epitaxy (LPE) is used to form a p-$Al_{0.2}Ga_{0.8}As$ layer 514, an n-$Al_{0.5}Ga_{0.5}As$ layer 520 and an $n^+$-GaAs layer 521 on a p-GaAs substrate 310 to form a heterojunction. n-Electrodes 322 and a p-electrode 324 are then formed by deposition, and the unnecessary portions of the n-electrode 322 are removed using photolithography and plasma etching.

A chemical process is then used to selectively etch the $n^+$-GaAs layer 521. Photolithography and chemical etching are then used on the non-light-emitting region to form mesa-shaped light-emitting regions with the n-AlGaAs layer 520 penetrating about 1 micron into the p-AlGaAs layer 514. Plasma CVD is then used to form an antireflection SiN layer 426, followed by the use of heat treatment to form ohmic contacts for the n-electrode 322 and p-electrode 324, thereby completing the fabrication of the heterojunction light-emitting diode array.

Structurally, this type of heterojunction light-emitting diode array consists of commercially available or conventional individual high-luminance LEDs arranged into a single array. The use of a heterojunction of the AlGaAs layer 514 and n-AlGaAs layer 520 provides an improvement in the injection efficiency, and by using an n-AlGaAs layer 520 which is transparent to the 720 nm light emitted by the light-emitting AlGaAs layer 514 attentuation of the light intensity caused by internal absorption is avoided, enabling an emission efficiency to be achieved that is several times higher than than achievable with the light-emitting diode array shown in FIG. 5.

However, there are a number of problems with the above-described heterojunction type LED arrays. As is known, unlike when single discrete LEDs are involved, an array of LEDs consisting of a multiplicity of light-emitting elements closely arranged on a single substrate has to achieve the following:

i) reduced optical crosstalk between light-emitting elements to prevent deterioration of characteristics caused by reflection or diffusion between the electrodes of adjacent light-emitting elements or at the edge portions of the SiN dielectric layer; and ii) reduction in the variance of characteristics among the light-emitting elements.

As described above, conventional heterojunction type light-emitting diode arrays use the n-AlGaAs layer 520 as a transparent window to raise the emission efficiency. It therefore follows that in order to reduce the crosstalk between adjacent elements, described in (i) above, the use of an an etching process for complete removal of the n-AlGaAs layer 520 between elements is essential. As well as increasing the complexity of the fabrication process, non-uniformity in the etching increases the variance in characteristics among the elements, which makes it impossible to achieve the aim described in (ii) above, thereby making it difficult to improve print quality.

SUMMARY OF THE INVENTION

An object of the present invention is therefore to provide a heterojunction type LED array that has a high emission efficiency and high uniformity.

In the present invention this object is attained with a heterojunction light-emitting diode array having a plurality of light-emitting diodes positioned in a desired arrangement on a substrate, each diode comprising: a superlattice layer on the substrate having alternations of a multiplicity of semiconductor layers that have different energy gaps, and a part of the said superlattice layer being doped with an impurity to form a diffusion mixed region, the diffusion mixed region which forms a light-emitting heterojunction at the interface with the superlattice layer, the diffusion having a larger energy gap than that of the superlattice layer, to thereby improve emission efficiency.

It is known that in a superlattice formed by alternating a multiplicity of semiconductor layers having different energy gaps, owing to the quantum effect the equivalent energy gap will be smaller than when a mixed semiconductor layer is used.

By using the superlattice layer as the light-emitting layer and using impurity-induced disordering of a portion of this superlattice layer, the conductor type thereof can be changed from a p- (or i) type to an n-type, or from an n (or i) to a p-type.

A heterojunction and p-n or p-i-n junction are thereby formed at the interface between the superlattice layer that has not been impurity-doped and the mixed layer that has been impurity-doped, in addition to which the mixed layer will have an energy gap that is larger than that of the superlattice layer that forms the light-emitting layer, thereby forming a window that will not absorb light emitted by the light-emitting layer to enable a high emission efficiency to be attained.

As the mixed layer forming this window is formed as part of the superlattice layer to constitute a heterojunction portion, it is not present between light-emitting elements which eliminates the previous need to employ etching to remove it, enabling a light-emitting diode array to be achieved that has low optical crosstalk and good uniformity.

BRIEF DESCRIPTION OF THE DRAWINGS

The objects and features of the present invention will become more apparent from the following detailed description taken in conjunction with the accompanying drawings in which.

DETAILED DESCRIPTION OF THE INVENTION

Figure 1:
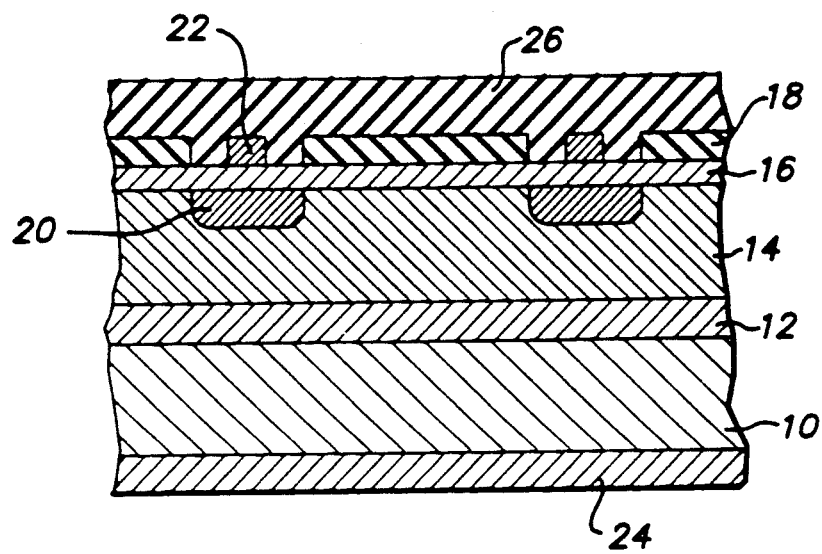
FIG. 1 is a cross-sectional view of a first embodiment of a light-emitting diode array according to the present invention.

FIG. 1 is a cross-sectional view of an AlGaAs system light-emitting diode array according to a first embodiment of the present invention. For simplification only two light-emitting elements are shown.

With reference to the drawing, molecular beam epitaxy (MBE) is used to form an n-GaAs buffer layer 12 (0.2 micron thick; $Si=1\times10^{18}$ cm$^{-3}$) on the n-GaAs substrate 10 (($Si=2\times10^{18}$ cm$^{-3}$), followed by an n-superlattice layer 14 (3.5 microns thick; $Si=8\times10^{17}$ cm$^{-3}$) and an n-GaAs protective layer 16 (50 Å thick; $Si=8\times10^{17}$ cm$^{-3}$). The n-superlattice layer 14 consists of 140 alternations of a 100 Å thin layer of $Al_{0.14}Ga_{0.86}As$ with a 150 Å thin layer of $Al_{0.7}Ga_{0.3}As$; the wavelength of the light thus emitted is about 780 nm.

Using the SiN layer 18 as a mask, Zn is used as the impurity dopant (to a depth of 1.5 microns) to induce a disordering of the superlattice structure, forming p-diffusion mixed regions 20, and at the same time a light-emitting element is produced by the p-n single heterojunction formed between the p-diffused mixed regions 20 and the n-superlattice layer 14. After the formation of the p-diffused mixed regions 20, p-electrodes 22 (Al) and an n-electrode 24 (AuGe/Ni/Au) are formed by deposition and photolithography is used to form the p-electrodes to the requisite shape for each light-emitting element.

Next the antireflection SiON coating 26 is applied which is removed at a region separated by a prescribed distance from the light-emitting element, to form p-electrode 22 bonding pads. Lastly, a heat treatment of 450° C. for 5 minutes is used to form ohmic contacts for the p-electrodes 22 and the n-electrode 24.

The AlGaAs system light-emitting diode array according to this embodiment is thus fabricated using the above processes. The composition of the p-diffused mixed region 20 disordered by the diffusion of zinc becomes $Al_{0.47}Ga_{0.52}As$, which has a larger energy gap than that of the n-superlattice layer 14 and therefore functions as a transparent window with respect to light having a wavelength of 780 nm emitted by the n-superlattice layer 14. As there is therefore no internal absorption of the light emitted by the n-superlattice layer 14, emission efficiency can be improved.

Also, as in this embodiment the p-diffused mixed region 20 that forms the window layer is not between light-emitting elements, the previous need to use an etching process to remove the region is eliminated, providing a light-emitting diode array that has good uniformity.

In addition, as in this embodiment adjacent light-emitting elements are coupled by the n-superlattice layer 14, the internal absorption of this layer enables optical crosstalk to be effectively reduced.

The N-GaAs protective layer 16 used in this embodiment is for preventing surface oxidation and coarsening of the surface of the AlGaAs layer accompanying the diffusion of the zinc; if required the formation of this layer may be dispensed with.

Figure 2:
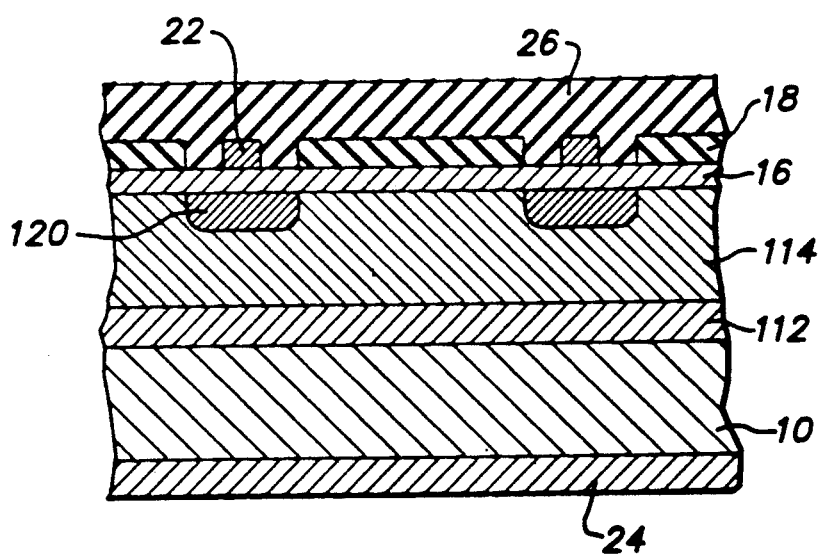
FIGS. 2, 3 and 4 are cross-sectional views of second, third and fourth embodiments, respectively, of the invention.

FIG. 2 is a cross-sectional view of AlGaInP system light-emitting diode array according to a second embodiment of the invention. For simplicity only two light-emitting elements are illustrated.

With reference to the figure, metal organic chemical vapor deposition (MOCVD) is used to form an n-GaAs buffer layer 112 (0.3 micron thick; $Se=2\times10^{18}$ cm$^{-3}$) on an n-GaAs protective layer 16. Here, the n-superlattice layer 114 consists of 125 alternations of a 120 Å thin layer of $Ga_{0.5}In_{0.5}P$ with a 160 Å thin layer of $Al_{0.5}In_{0.5}P$; the wavelength of the light thus emitted is about 660 nm.

Using the SiN layer 18 as a mask, Zn is used as the impurity dopant (to a depth of 1.5 microns) to induce a disordering of the superlattice structure, forming p-diffusion mixed regions 120, and at the same time a light-emitting element is produced by the p-n single therojunction formed between the p-diffused mixed regions 120 and the n-superlattice layer 114.

After the formation of the p-diffused mixed regions 120, p-electrodes 22 (Al) and an n-electrode 24 (AuGe/Ni/Au) are formed by deposition and photolithography is used to form the p-electrodes 22 to requisite shape for each light-emitting element.

Next an antireflection SiOn coating 26 is applied which is removed at a region separated by a prescribed distance from the light-emitting element, to form p-electrode 22 bonding pads. Lastly, a heat treatment of 450° C. for 5 minutes is used to form ohmic contacts for the p-electrodes 22 and the n-electrode 24.

The AlGaAs system light-emitting diode array according to this embodiment is thus fabricated using the above processes. The composition of the p-diffused mixed region 120 disordered by the diffusion of zinc becomes $(Al_{0.571}Ga_{0.49})_{0.5}In_{0.5}P$, which has a larger energy gap than that of the n-superlattice layer 114 and therefore functions as a window with respect to light having a wavelength of 660 nm emitted by the n-superlattice layer 114. As there is therefore no internal absorption of the light emitted by the n-superlattice layer 114, emission efficiency can be improved.

Also, since the p-diffused mixed region 20 that forms the window layer is not between light-emitting elements, the previous requirement to use an etching process to remove the region is eliminated, providing a light-emitting diode array that has good uniformity.

In addition, as in this embodiment adjacent light-emitting elements are coupled by the n-superlattice layer 114, the internal absorption of this layer enables optical crosstalk to be effectively reduced.

the n-GaAs protective layer 16 used in this embodiment is for preventing surface oxidation and coarsening of the surface of the AlGaInP layer accompanying the diffusion of the zinc; if required the formation of his layer may be dispensed with.

Figure 3:
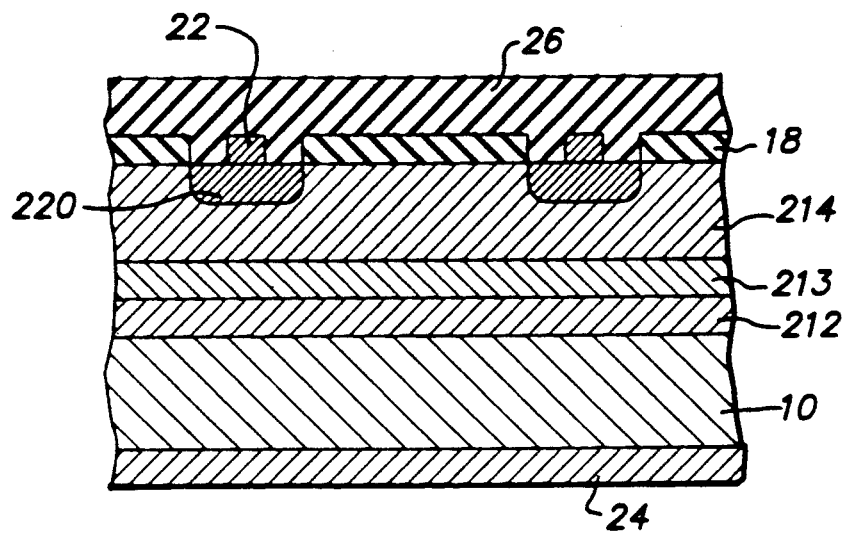

FIG. 3 is a cross-sectional view of an AlGaInAsP system light-emitting diode array according to a third embodiment of the invention. For simplicity, only two light-emitting elements are illustrated.

With reference to the figure, gas source MBE (GSMBE) employing a group III metal and AsH$_3$ and PH$_3$ as a group V material is used to form an n-GaAs layer 212 (0.2 micron thick; $Si = 1 \times 10^{18}$ cm$^{-3}$), an n-GaAsP graded buffered layer 213 (0.4 micron thick; $Si = 1 \times 10^{18}$ cm$^{-3}$) and an n-superlattice layer 214 (3.5 microns thick; $Si = 7 \times 10^{17}$ cm$-3$) on an n-GaAs substrate 10 ($Si = 2 \times 10^{18}$ cm$^{-3}$). Here, the n-superlattice layer 214 consists of 140 alternations of a 100 Å thin layer of $GaAs_{0.6}P_{0.4}$ with a 150 Å thin layer of $Al_{0.71}In_{0.29}P$; the wavelength of the light thus emitted is about 650 nm.

Using the SiN layer 18 as a mask, Zn is used as the impurity dopant (to a depth of 1.5 microns) to induce a disordering of the superlattice structure, forming p-diffusion mixed regions 120, and at the same time a light-emitting element is produced by the p-n single heterojunction formed between the n-diffused mixed regions 120 and the n-superlattice layer 214.

After the formation of the p-diffused mixed regions 220, p-electrodes 22 (Al) and n-electrode 24 (AuGe/Ni/Au) are formed by deposition and photolithography is used to form the p-electrodes 22 to the requisite shape for each light-emitting element.

Next an antireflection SiON coating 26 is applied which is removed at a region separated by a prescribed distance from the light-emitting element, for form p-electrode 22 bonding pads. Lastly, a heat treatment of 450° C. for 5 minutes is used to form ohmic contacts for the p-electrodes 22 and the n-electrode 24.

The AlGaInAsP system light-emitting diode array according to this embodiment is thus fabricated using the above processes. The composition of the p-diffused mixed region 220 disordered by the diffusion of zinc becomes $(Al_{0.516}Ga0.484)_{0.826}In_{0.174}As_{0.24}P_{0.76}$, which functions as a transparent window with respect to emitted light having a wavelength of 650 nm. There is therefore no internal absorption of the light emitted by the n-superlattice layer enabling emission efficiency to be improved.

Also, as in this embodiment the p-diffused mixed region 220 that forms the window layer is not between light-emitting elements, the previous need to use an etching process to remove the region is eliminated, providing a light-emitting diode array that has good uniformity.

In addition, adjacent light-emitting elements are coupled by the n-superlattice layer 214, the internal absorption of this layer enables optical crosstalk to be effectively reduced.

In this embodiment the emitting material used in GaAsP which has a lattice structure that does not match that of the n-GaAs substrate 10, but the n-GaAsP graded buffer layer 213 helps to improve the crystallinity and prevent a decrease in the emission efficiency.

Figure 4:
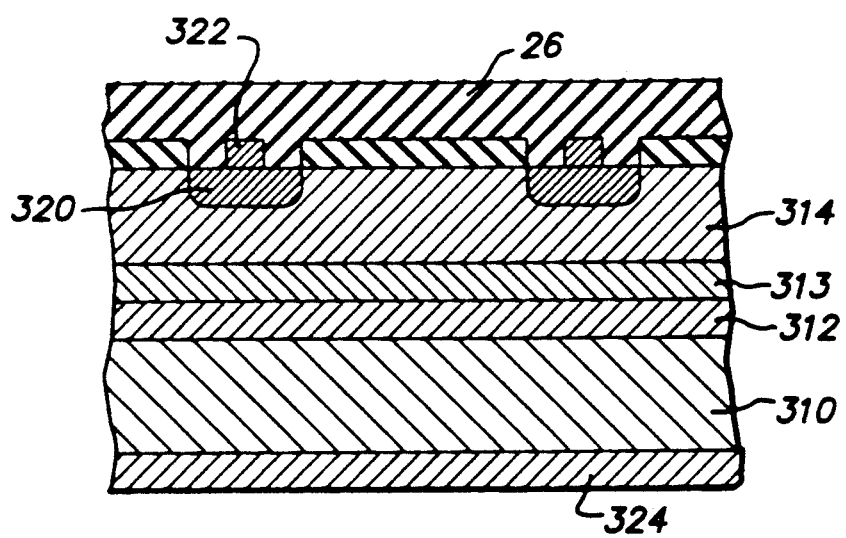
Figure 5:
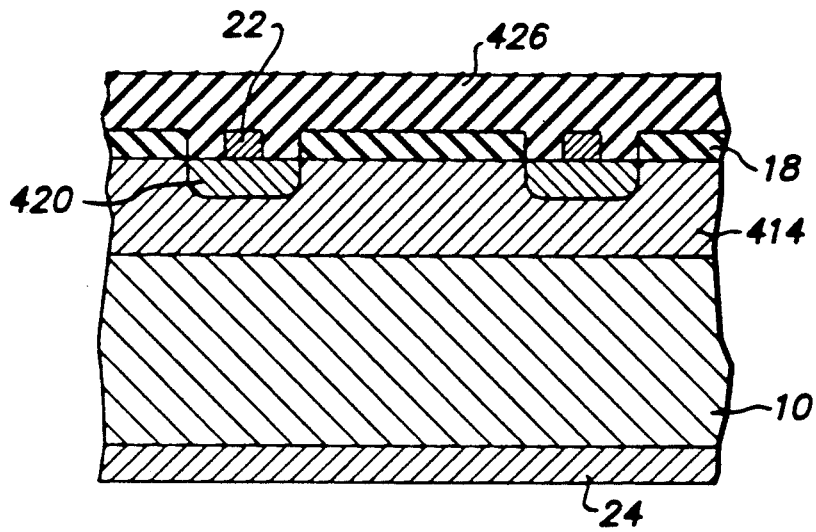
FIG. 5 is a cross-sectional view of a conventional homojunction light-emitting diode array.
Figure 6:
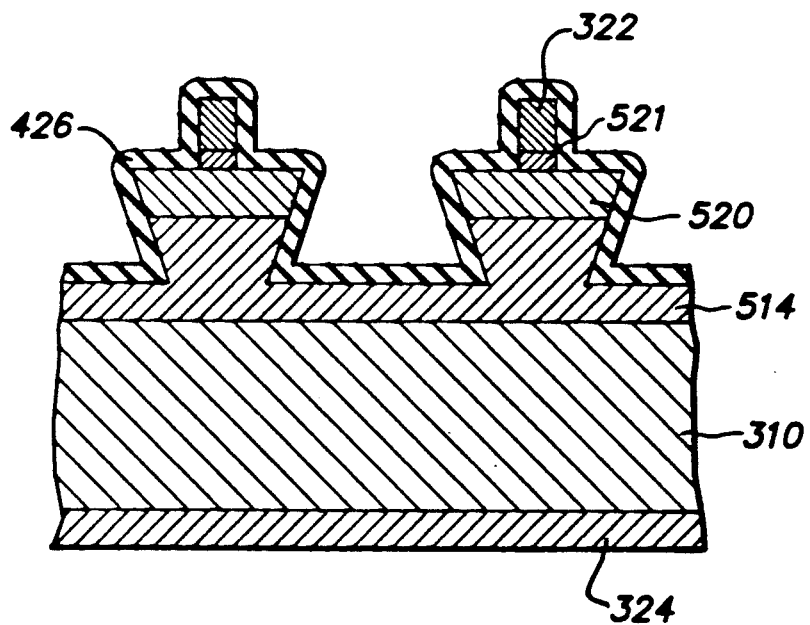
FIG. 6 is a cross-sectional view of a conventional heterojunction light-emitting diode array.

FIG. 4 is a cross-sectional view of an AlGaAs system light-emitting diode array according to a fourth embodiment of the invention. For simplicity only two light-emitting elements are illustrated With reference to the figure, MBE is used to form a p-GaAs layer 312 (0.2 micron thick; $Be = 1 \times 10^{18}$ cm$^{-3}$), a p-superlattice layer 313 (1.0 micron thick; $Be = 1 \times 10^{18}$ cm$^{-3}$) and an undoped superlattice layer 314 (1.5 microns) on a p-GaAs substrate 310 ($Zn = x \times 10^{18}$ cm$^{-3}$). The superlattice layers 313 and 314 consist of 60 alternations of a 100 Å thin layer of $Al_{0.14}Ga_{0.86}As$ with a 150 Å thin layer of $Al_{0.7}Ga_{0.3}As$.

Using the SiN layer 18 as a mask, Si is used as the impurity dopant (to a depth of 1.0 microns) to induce a disordering of the superlattice structure, forming n-diffused mixed regions 320. At the same time, a light-emitting element is produced by the n-i-p single heterojunction formed between the n-diffused mixed region 320, and the i-superlattice layer 314 and p-superlattice layer 313.

After the formation of the n-diffused mixed regions 320, n-electrodes 322 (Al) and a p-electrode 324 (AuZ-/Au) are formed by deposition and photolithography is used to form the n-electrodes 322 to the requisite shape for each light-emitting element.

Next an antireflection SiON coating 26 is applied which is removed at a region separated by a prescribed distance from the light-emitting element, to form n-electrode 322 bonding pads. Lastly, a heat treatment of 450° C. for 5 minutes is used to form ohmic contacts for the n-electrodes 322 and the p-electrode 324.

Because the n-i-p junction causes the injected carrier electrons to move from the n-diffused mixed region 320 towards the p-superlattice layer 313, the emission region becomes the part of the undoped i-superlattice layer 314 directly beneath the n-diffused mixed region 320, so that when the injected carriers are electrons with a large diffusion length it is possible to decrease the depletion of the emission region caused by the horizontal spread of carriers.

The foregoing description of each embodiment has been made with reference to specific layer thicknesses and compositions such as AlGaAs, AlGaInP and AlGaInAsP. However, it is to be understood that the present invention is not limited thereto but that, instead, other requisite layer thicknesses and semiconductor material compositions may be used such as, for example GaInAsP, GaAlInP, AlGaInAs and AlGaAsSb.

Also, although in the embodiments MBE, MOCVD and GSMBE were used to form the semiconductive layers on the substrates, the light-emitting diode array according to this invention may also be fabricated using other epitaxial techniques such as chemical beam epitaxy (CBE) employing an organometallic gas on a group III material.

Furthermore, although in the embodiments zinc and silicon were employed as the impurities used for doping to induce disordering of the superlattice structure, other types of diffusion substance may be used, or ion implantation used in combination with annealing to effect disordering and conductor type conversion at the same time.

As described in the foregoing, in accordance with this invention a high efficiency light-emitting diode array can be obtained that has good uniformity and low crosstalk between adjacent light-emitting elements.

The invention has been described in detail with particular reference to certain preferred embodiments thereof, but it will be understood that variations and modifications can be effected within the spirit and scope of the invention.

What is claimed is:

1. A heterojunction light-emitting diode array having a plurality of light-emitting diodes positioned in a desired arrangement on a substrate each diode comprising:
   a superlattice layer on the substrate having alternations of a multiplicity of layers of at least two different semiconductor materials with one of the semiconductor materials having a band gap larger than the other semiconductor materials, and a region of said superlattice layer being doped with an impurity different from that contained in the layers of the superlattice layer to form a diffusion mixed region, the diffusion mixed region forming a light-emitting heterojunction at its interface with the superlattice layer and serving as a window for light generated at the junction, the diffusion mixed region having a larger energy gap than that of the superlattice layer, the superlattice layer having no internal adsorption of the light so as to reduce cross-talk between diodes to thereby improve emission efficiency.

2. The diode array of claim 1 wherein the superlattice layer is n-type and the diffusion mixed region is p-type.

3. The diode array of claim 1 wherein the superlattice layer is undoped, the diffusion mixed region is doped n-type and further including a second superlattice layer having alternating of a multiplicity of layers of at least two different semiconductor materials which are p-type and which is in contact with the said undoped superlattice layer.

4. A heterojunction light-emitting diode array having a plurality of light-emitting diodes positioned in a desired arrangement comprising:
   a substrate;
   a superlattice layer on said substrate, said superlattice layer comprising alternations of a plurality of layers of at least two different semiconductor materials with one of the materials having a band gap larger than the other semiconductor materials; and
   a plurality of spaced regions in said superlattice layer containing a doping impurity different from that in the layers of the superlattice layer to form diffusion mixed regions, each diffusion mixed region forming a light-emitting heterojunction with the superlattice layer and having a larger band gap than that of the superlattice layer;
   each of the diffusion mixed regions serving as a window for the generated light and the superlattice layer having no internal absorptions of the light so as to reduce cross-talk between the diodes in the array to thereby improve emission efficiency.

5. The diode array of claim 4 in which the diffusion mixed regions are doped p-type.

6. The diode array of claim 5 in which the superlattice layer is doped n-type.

7. The diode array of claim 4 in which the superlattice layer is undoped, the diffusion mixed region is doped p-type and further comprising a second superlattice layer of a plurality of layers of at least two different semiconductor materials which is doped n-type between the undoped superlattice layer and the substrate.

* * * * *